(12) United States Patent
Geis et al.

(10) Patent No.: US 7,880,204 B2
(45) Date of Patent: Feb. 1, 2011

(54) SYSTEM AND METHOD FOR PROVIDING A HIGH FREQUENCY RESPONSE SILICON PHOTODETECTOR

(75) Inventors: Michael W. Geis, Acton, MA (US); Steven J. Spector, Arlington, MA (US); Donna M. Lennon, Bedford, MA (US); Matthew E. Grein, Cambridge, MA (US); Robert T. Schulein, Watertown, MA (US); Jung U. Yoon, Belmont, MA (US); Franz Xaver Kaertner, Newtonville, MA (US); Fuwan Gan, Cambridge, MA (US); Theodore M. Lyszczarz, Concord, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 578 days.

(21) Appl. No.: 11/541,975

(22) Filed: Oct. 2, 2006

(65) Prior Publication Data
US 2010/0025787 A1    Feb. 4, 2010

(51) Int. Cl.
*H01L 31/062*    (2006.01)
*H01L 31/113*    (2006.01)

(52) U.S. Cl. .......... 257/292; 257/77; 257/293; 257/437; 257/440; 257/443; 257/446; 257/E27.131; 257/E27.132; 257/E27.133; 257/E27.148; 438/706; 438/710; 438/712; 438/720

(58) Field of Classification Search ............ 257/77, 257/437, 440, 443, 446, 292, E27.131, E27.132, 257/E27.133, E27.148; 438/706, 710, 712, 438/720
See application file for complete search history.

(56) References Cited

U.S. PATENT DOCUMENTS

| | | | |
|---|---|---|---|
| 5,311,036 A * | 5/1994 | Nishino et al. | 257/30 |
| 5,671,914 A | 9/1997 | Kalkhoran et al. | |
| 6,294,726 B1 | 9/2001 | Hassler et al. | |
| 6,451,702 B1 | 9/2002 | Yang et al. | |
| 2002/0131135 A1 * | 9/2002 | Chow et al. | 359/189 |
| 2004/0171228 A1 * | 9/2004 | Matsumura et al. | 438/407 |
| 2005/0012087 A1 * | 1/2005 | Sheu et al. | 257/14 |
| 2006/0165341 A1 | 7/2006 | Yan et al. | |
| 2006/0192233 A1 * | 8/2006 | Ellis-Monaghan et al. | 257/292 |

\* cited by examiner

*Primary Examiner*—Cuong Q Nguyen
*Assistant Examiner*—Meiya Li
(74) *Attorney, Agent, or Firm*—Peter A. Nieves; Sheehan Phinney; Bass + Green PA

(57) ABSTRACT

A Silicon photodetector contains an insulating substrate having a top surface and a bottom surface. A Silicon layer is located on the top surface of the insulating substrate, where the Silicon layer contains a center region, the center region being larger in thickness than the rest of the Silicon layer. A top Silicon dioxide layer is located on a top surface of the center region. A left wing of the center region and a right wing of the center region are doped. The Silicon photodetector also has an active region located within the center region, where the active region contains a tailored crystal defect-impurity combination and Oxygen atoms.

11 Claims, 7 Drawing Sheets

_US 7,880,204 B2_

SYSTEM AND METHOD FOR PROVIDING A HIGH FREQUENCY RESPONSE SILICON PHOTODETECTOR

GOVERNMENT LICENSE RIGHTS

This invention was made with government support under Contract Number: FA8721-05-C-0002, awarded by the U.S. Air Force and under Grant Number W911NF-04-1-0431, awarded by the U.S. Army. The government has certain rights in the invention.

FIELD OF THE INVENTION

The present invention is generally related to optical data communication, and more particularly is related to a silicon photodetector having a high frequency response.

BACKGROUND OF THE INVENTION

The receiver side of an optical data communication system is typically comprised of an optical fiber, electrical connectors, an optical-electronic interfacing circuit, and a destination integrated electronic processing circuit. One main element in the electronic interfacing technology is a light sensor, which is used to detect the incoming optical signal. The optical signal can be contained in one specific frequency band after optical filtering, as in wavelength division multiplexing (WDM), or it can be unfiltered and composed of various wavelengths. The light sensor (e.g., photodetector) converts the detected light into electrical current to be used by the destination integrated electronic processing circuit.

Typically, the light sensor is separated from the processing integrated circuit and is connected to both the optical fiber and the integrated circuit. Light sensors, such as, but not limited to, InGaAs photodetectors, are costly and require a manufacturing process that differs from the process for manufacturing the electrical chip. In addition, the material used for such photodetectors may be costly. Therefore, use of the photodetectors, as a separate discrete component, adds manufacturing time and manufacturing cost to the completion of an optical receiver.

In addition to the abovementioned, the computational speed of the integrated circuit chip is limited by the frequency response of the photodetector. In other words, if the computational speed of the chip is faster than the frequency response of the photodetector, the complete system's computational speed will be equal to the lower value, that of the photodetector.

Photodetectors have been manufactured using, for example, Germanium epitaxially grown on Silicon. Because Germanium has a smaller bandgap than Silicon, these photodetectors detect radiation of infrared photons. Such photodetectors typically exhibit responsivity between 0.2 and 0.4 A $W^{-1}$ and frequency response of 2 gigahertz or less, but exhibit very poor response for wavelengths greater that 1.5 micrometers. If the photodetector were one hundred percent efficient the photoresponse would be 1.25 A $W^{-1}$ for 1.5 micrometer radiation. The Germanium photodetectors require thermal cycles that are difficult to incorporate in CMOS processing. Others have created Silicon photodetectors using ion implantation, however their devices have limited frequency response of approximately 2 MHz and weakly absorb the radiation, resulting in reduced photoresponse. Unfortunately, these photodetectors still do not have a fast enough frequency response and suffer processing damage at temperatures above 200 C, which are required for CMOS processing.

Thus, a heretofore unaddressed need exists in the industry to address the aforementioned deficiencies and inadequacies.

SUMMARY OF THE INVENTION

Embodiments of the present invention provide a system and method for a Silicon optical waveguide photodetector that produces an electrical current by absorbing light of wavelengths from 1100 nm to >1750 nm in direct relationship to light intensity. Briefly described, in architecture, one embodiment of the system, among others, can be implemented as follows. The photodetector contains an insulating substrate having a top surface and a bottom surface. A Silicon layer is located on the top surface of the insulating substrate, where the Silicon layer contains a center region. The center region is larger in thickness than the rest of the Silicon layer. A top Silicon dioxide layer is located on a top surface of the center region. The photodetector has a left wing of the center region, wherein a side portion of the left wing is a left side portion of the center region and a bottom portion of the left wing is a first portion of the Silicon layer that is located to the left of the center region. The photodetector also has a right wing of the center region, wherein a side portion of the right wing is a right side portion of the center region and a bottom portion of the right wing is a second portion of the Silicon layer that is located to the right of said center region. An active region is located within said center region, wherein said active region contains a tailored crystal defect-impurity combination and Oxygen atoms.

The present invention can also be viewed as providing methods for providing a Silicon photodetector. In this regard, one embodiment of such a method, among others, can be broadly summarized by the following steps: fabricating a Silicon-on-insulator wafer, resulting in a first layer and a second layer; forming a Silicon dioxide layer on a portion of the top surface of the first layer, a portion of the first layer located below the Silicon dioxide layer being referred to as a center region; thinning the first layer except for the center region; doping a left side portion of the center region and a portion of the first layer located left of the center region; doping a right side portion of the center region and a portion of the first layer located right of the center region; and performing ion implantation on the Silicon dioxide layer resulting in formation of an active region within the center region, the active region containing a tailored crystal defect-impurity combination and Oxygen atoms.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

A Silicon photodetector is provided, having reduced dimensions and tailored defect-impurity generated by implantation. The Silicon photodetector may be a photodiode or a photoconductor. In accordance with the first exemplary embodiment of the invention, the photodetector is a photodiode. The submicrometer dimensions of the photodetector, as described in detail herein, in combination with a waveguide, result in the structure being considered a strip waveguide. That is, the optical mode of the waveguide is consistent with light moving through a rectangular waveguide as opposed to a rib waveguide where the optical mode has significant energy in the "wings" attached to the waveguide. The combination of the strip waveguide and the tailored implantation defects, as described in detail herein, allows photodetectors to be formed simultaneously having the capability of maintaining a frequency response that may be in excess of approximately 20 GHz, having responsivity to radiation with wavelengths of greater than 1100 nm (1.5 A $W^{-1}$ at 1550 nm), and a leakage current of approximately 50 to 300 nanoampers for bias voltages from 5 to 20 V. Responsivity in excess of 1.25 A $W^{-1}$ is the result detector response in excess of the quantum limit through some charge gain mechanism. The photodetectors do not require thermal processing, but can be annealed to high temperatures for extended periods of time, without damage. As an example, the photodetectors can be annealed to, for example, but not limited to, 450 Celsius for 15 minutes without damage.

Structure of the Silicon photodetector is described herein, as well as a process of providing the Silicon photodetector. It should be noted that the dimensions and process of providing the photodetector described herein, are exemplary and are not intended to limit the scope of the present invention.

Figure 1:
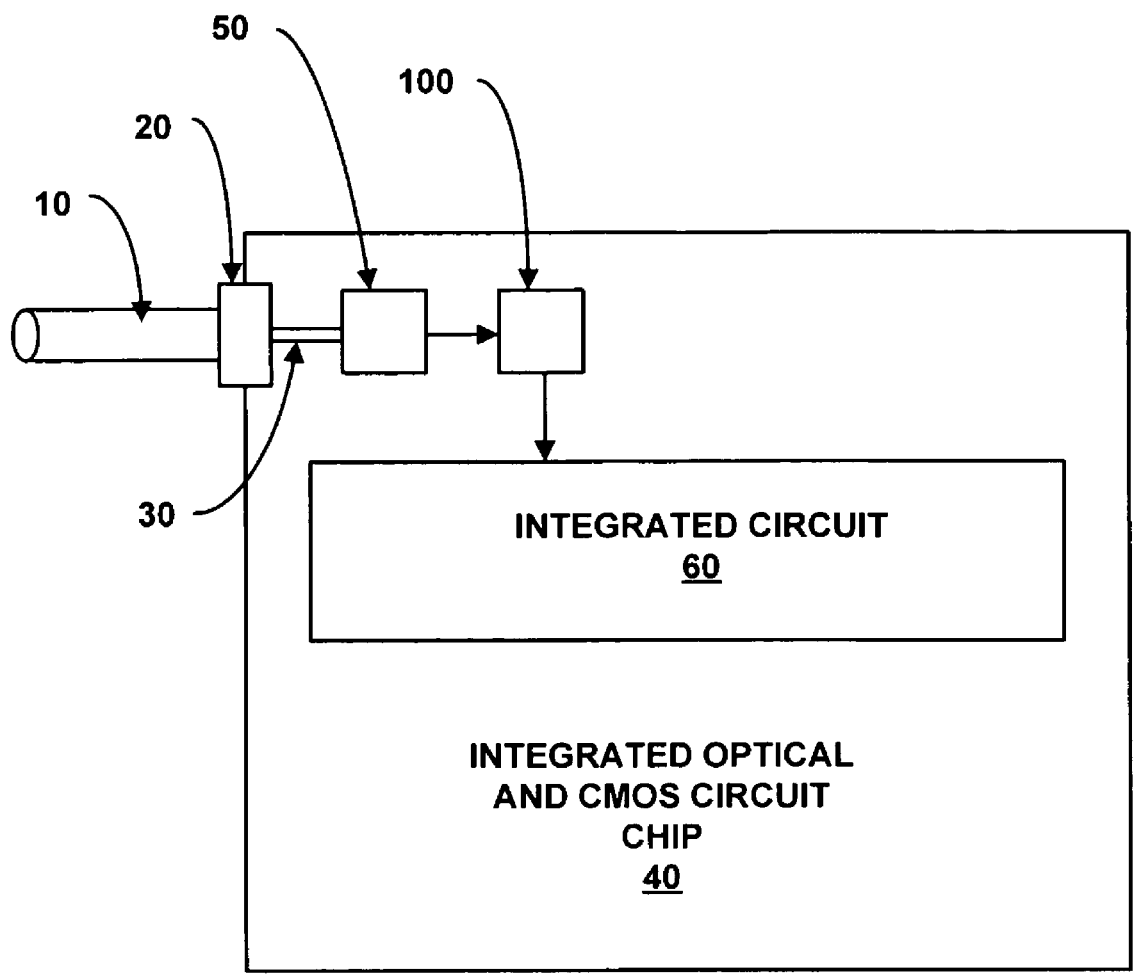
FIG. 1 is a schematic diagram illustrating an environment in which the present photodetector may be provided.

FIG. 1 is a schematic diagram illustrating an environment in which the present photodetector may be provided. It should noted that the elements of FIG. 1 are not drawn to scale, but instead, are provided for illustration purposes. As is shown by FIG. 1, an optical fiber 10 is connected to an optical coupler 20, where the optical coupler 20 is capable of coupling an optical signal received via the optical fiber 10, to a waveguide 30 located on a chip 40. The waveguide 30, which may be composed of Silicon, guides the optical signal to an optical filter block 50.

The optical filter block 50 may contain one or more optical filters therein. Each optical filter within the optical filter block 50 filters at a specific frequency channel and allows photons received in that frequency channel to pass to the photodetector. As is known by those having ordinary skill in the art, the number of optical filters located within the optical filter block 50 depends upon the number of optical channels required to be received by the chip 40. As an example, if the chip 40 were to receive data in four channels, four optical filters and four photodiodes would be provided. Alternatively, if the chip were to receive data in eight channels, eight optical filters and photodiodes would be provided.

Photodetectors 100 are connected to each of the optical filter outputs within the optical filter block 50. In accordance with the first exemplary embodiment of the invention, the photodetectors 100 are photodiodes. These photodiodes 100 convert the filtered optical signal into photocurrent, which is forwarded to an integrated circuit 60 to use in accordance with functionality performed by the chip 40. Of course, other logic may be provided between the photodiodes 100 and the integrated circuit, such as, but not limited to, a receiver preamplifier (not shown). As is explained in detail herein, the photodiodes 100 are fabricated as a portion of the chip 40 and not as separate devices. Fabrication of the photodiode 100 in accordance with the present invention is described in detail with regard to FIG. 4.

Since the photodiodes 100 of the present invention have an increased frequency response, as is explained in detail herein below, these photodiodes 100 allow the chip 40 to process data at an increased rate that is not unnecessarily limited by the frequency response of the photodiode 100.

In accordance with an alternative embodiment of the invention, multiple photodetectors with or without optical filters might be aligned on the chip 40, thereby allowing connection to a fiber ribbon having multiple optical fibers therein.

Figure 2:
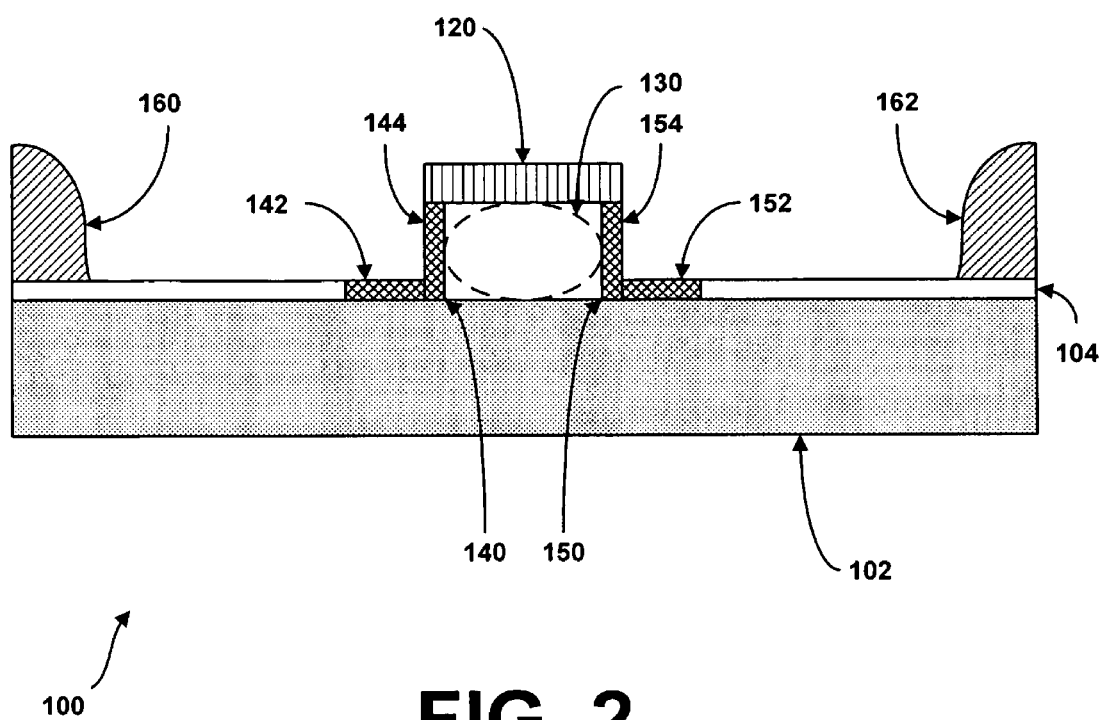
FIG. 2 is a schematic diagram further illustrating a photodetector in accordance with the first exemplary embodiment of the invention.

FIG. 2 is a cross-sectional view of the photodiode 100 of FIG. 1, in accordance with the first exemplary embodiment of the invention. The photodiode 100 contains a bottom insulating layer 102, which is preferably made of Silicon dioxide although silicon nitride or aluminum oxide in the form of sapphire are other examples. The bottom layer 102 is elongated in the horizontal axis and contains a top surface and a bottom surface. Specifically, the bottom layer 102 is a portion of the chip 40 on which the photodiode 100 is fabricated. Therefore, dimensions of the bottom layer 102 are in accordance with a desired length of the photodiode 100.

Figure 3:
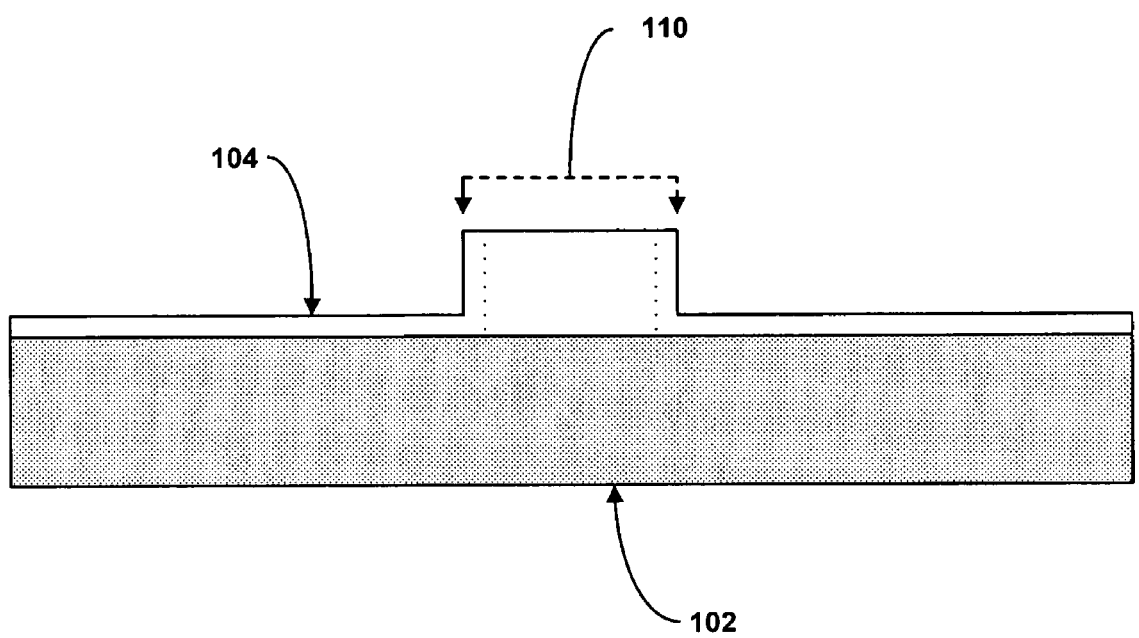
FIG. 3 is a schematic diagram further illustrating the bottom layer, Silicon layer, and center region of the Silicon layer.

A Silicon layer 104 is located on the top surface of the bottom layer 102. Similar to the bottom layer 102, width of the Silicon layer 104 is determined based upon a desired size of the photodiode 100. A thickness of the Silicon layer 104 is generally approximately fifty nanometers, except for at a center region 110 of the Silicon layer 104. FIG. 3 further illustrates the bottom layer 102, Silicon layer 104, and center region 110 of the Silicon layer 104.

The center region 110 of the Silicon layer 104 measures approximately five hundred and twenty nanometers in width, and has a thickness of approximately two hundred and twenty nanometers. The following describes portions of the center region 110.

Returning to FIG. 2, the photodiode 100 contains a first wing 140 and a second wing 150. The wings are preferably electrically contacted with heavily doped Silicon, which is thin enough so as not to interfere with the light in the waveguide. This is further explained below.

The first wing 140 contains a bottom portion 142 and a side portion 144. The bottom portion 142 of the first wing 140 is a portion of the Silicon layer 104 measuring approximately one hundred to two hundred nanometers in width, and being to the left of the center region 110. The side portion 144 of the first wing 140 is a left side portion of the center region 110 having a thickness of approximately fifty nanometers. Since, in accordance with the first exemplary embodiment of the invention, the photodetector is a photodiode, both the side portion 144 and the bottom portion 142 of the first wing 140 are p-type doped.

The second wing 150 contains a bottom portion 152 and a side portion 154. The bottom portion 152 of the second wing 150 is a portion of the Silicon layer 104 measuring approximately one hundred to two hundred nanometers in width, and being to the right of the center region 110. The side portion 154 of the second wing 150 is a right side portion of the center region 110 having a thickness of approximately fifty nanometers. Since, in accordance with the first exemplary embodiment of the invention, the photodetector is a photodiode, both the side portion 154 and the bottom portion 152 of the second wing 150 are n-type doped. Since the first and second wings 140, 150 of the photodiode 100 are so thin, they do not significantly modify the optical mode.

It should be noted that in accordance with a second exemplary embodiment of the invention, the photodetector may be an n-type photoconductor, where the first wing 140 and the second wing 150 are both n-type doped. In addition, in accordance with a third exemplary embodiment of the invention, the photodetector may be a p-type photoconductor, where the first wing and the second wing are both p-type doped.

Returning to FIG. 2, a top Silicon dioxide layer 120 is located on the top surface of the center region 110. Preferably, the top Silicon dioxide layer 120 is patterned in preparation for ion implantation, as is explained in detail below. Alternatively, the top Silicon dioxide layer 120 may cover the entire top surface of the center region 110. Dimensions of the top Silicon dioxide layer 120 may be, for example, but not limited to, ninety nanometers in thickness and five hundred nanometers in width. Having the top Silicon dioxide layer 120 on the top surface of the center region 110 allows for Oxygen atoms within the top Silicon dioxide layer 120 to be carried into the center region 110 during ion implantation, as is explained in detail below. Specifically, ion implantation results in the creation of an active defect-impurity region 130 within the center region 110. In accordance with alternative embodiments of the invention, Oxygen can be ion implanted and/or the active region can be doped with Oxygen by annealing above 1000° C. in an oxygen and/or nitrogen atmosphere.

The active region 130 contains a tailored crystal defect-impurity combination, which is the result of ion implantation. In addition, the active region 130 is populated with Oxygen atoms, which stabilize the ion implantation damage of the active region 130, resulting in the photodiode 100 having enhanced thermal stability. Dimensions of the active region 130 of the photodiode 100 may be, for example, but not limited to, approximately two hundred and twenty nanometers in height and four hundred and twenty nanometers in width.

Figure 7:
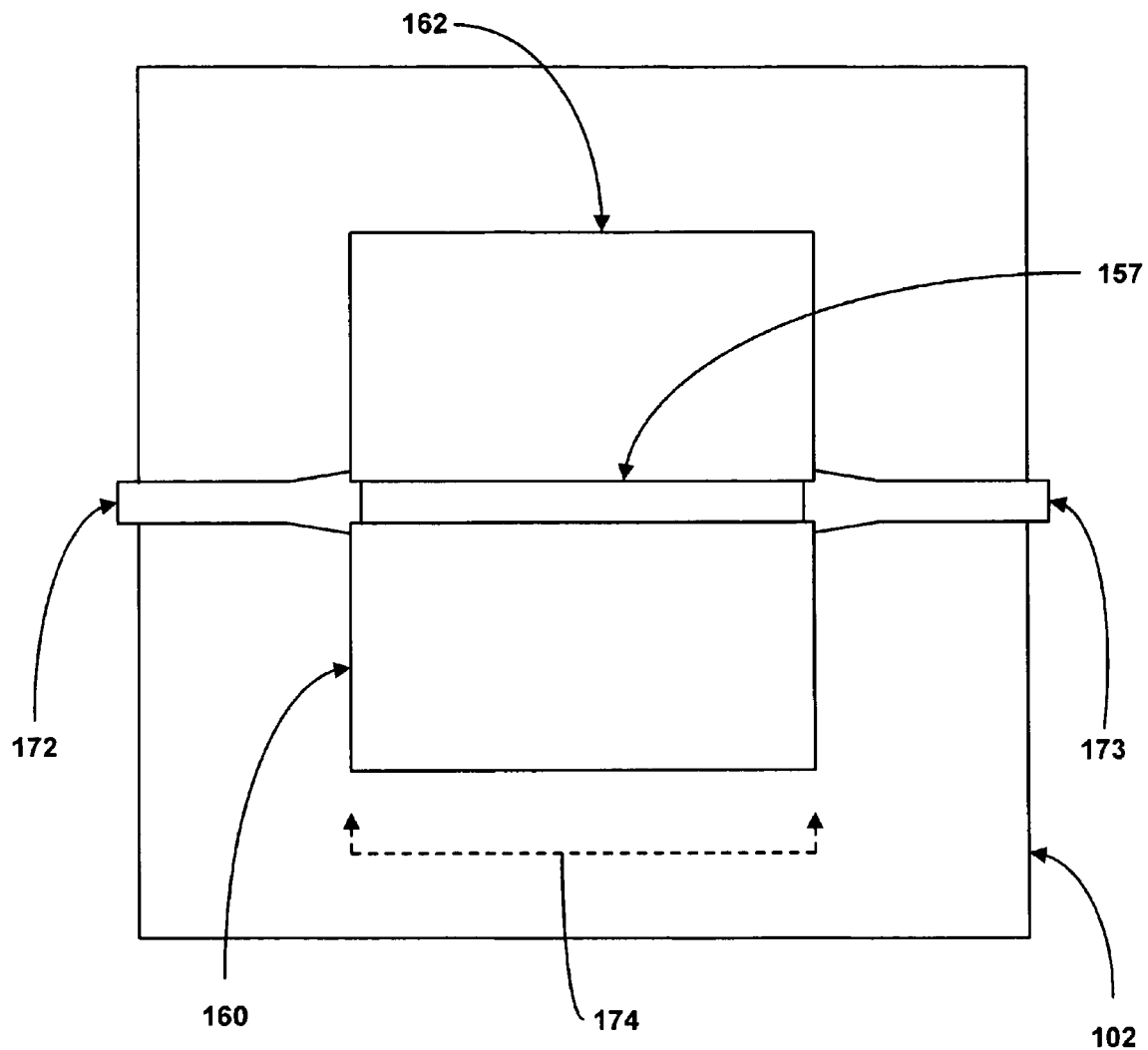
FIG. 7 is a top view of the waveguide and Silicon photodetector.

FIG. 7 shows the waveguide entrance 172 and exit 173 from the Silicon photodetector 100. It should be noted that there is no need for wing contacts outside of the photodetector region. The length 174 of the detector 100 is determined by the absorption of the light. For the defect-impurity complexes used here, a length of 0.25 mm is sufficient to absorb half of the light entering the waveguide. The required length to absorb half the incoming radiation varies with wavelength and the defect-impurity density. As an example, for the conduction discussed here, 0.1 mm is required at 1270 nm and several millimeters are needed for 1740 nm radiation.

The mechanism responsible for generating photocurrent in the photodiode 100 starts with phototransition of an electron from a valence band to a mid-bandgap state that is approximately 0.65 eV above the valence band. The electric field in the active region 130 facilitates this transition. Small waveguides, less than a micrometer in width 110, as provided by the photodetector 100 of the present invention, considerably enhance this electron transition and responsivity with a large electric field (e.g., $4 \times 10^5$ V cm$^{-1}$ at 20V) confined primarily to the active region and the region where the optical mode is most intense. 130.

A first conductive contact 160 is located on a left side of the photodiode 100. As an example, the first conductive contact 160 may be located approximately nine hundred nanometers left of the side portion 144 of the first wing 140. In addition, a second conductive contact 162 is located on a right side of the photodiode 100. As an example, the second conductive contact 162 may be located approximately nine hundred nanometers right of the side portion 154 of the second wing 150. The first and second conductive contacts 160, 162 may be, for example, Aluminum contacts.

Figure 4:
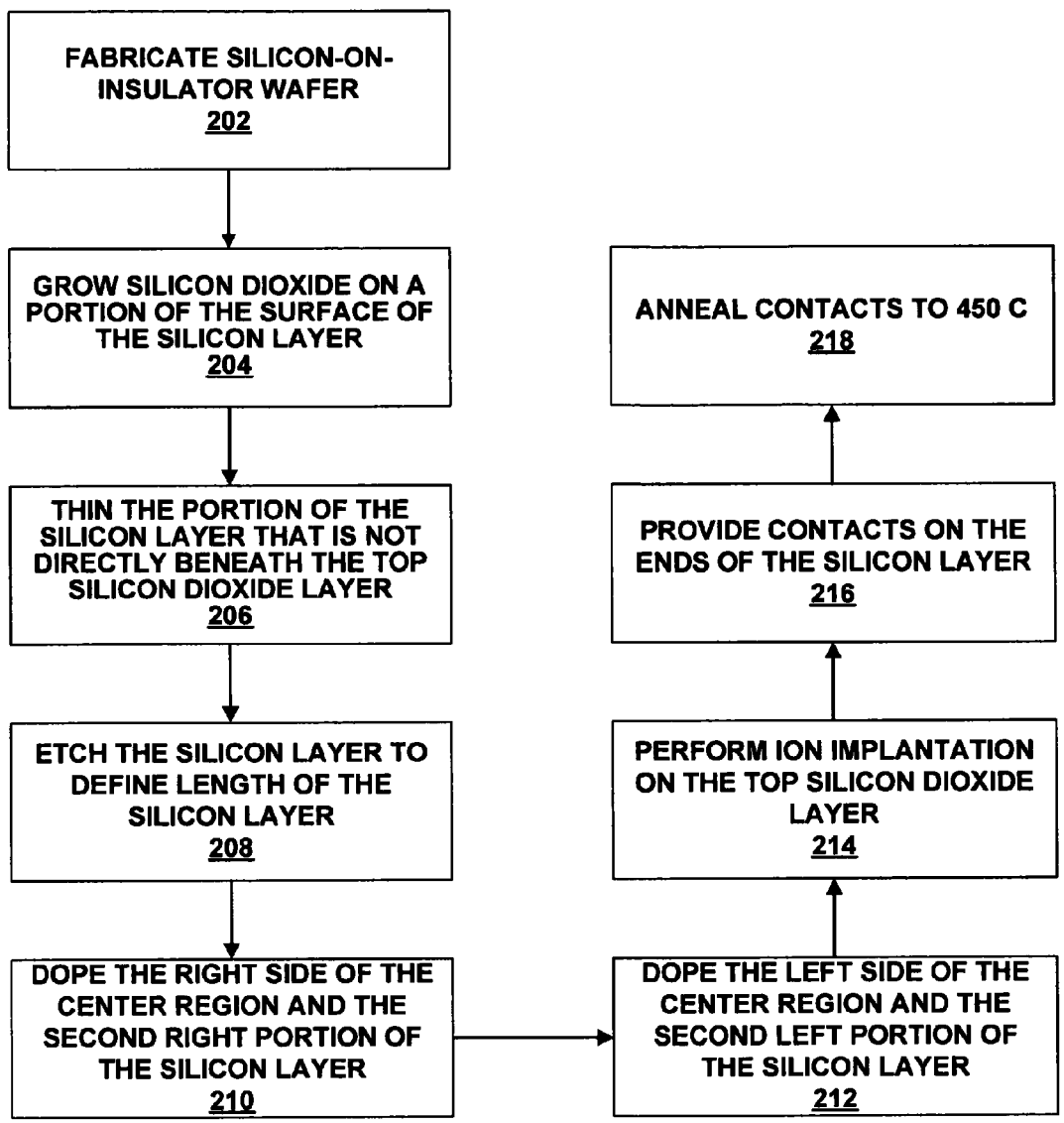
FIG. 4 is a flowchart illustrating a method of fabrication of the photodiode of FIG. 2.

FIG. 4 is a flowchart 200 illustrating a method of fabricating the abovementioned photodiode 100, in accordance with the first exemplary embodiment of the invention. It should be noted that any process descriptions or blocks in flow charts should be understood as representing modules, segments, portions of code, or steps that include one or more instructions for implementing specific logical functions in the process, and alternate implementations are included within the scope of the present invention in which functions may be executed out of order from that shown or discussed, including substantially concurrently or in reverse order, depending on the functionality involved, as would be understood by those reasonably skilled in the art of the present invention. It should also be noted that the dimensions provided below are exemplary and not intended to unnecessarily limit the present invention. One having ordinary skill in the art would appreciate that other dimensions of the photodiode 100 may be utilized.

As is shown by block 202, a silicon-on-insulator (SOI) wafer is fabricated. Numerous methods may be used to fabricate the SOI wafer. Since one of the benefits of the present strip waveguide is associated with its size (i.e., thickness), one process of fabricating the SOI wafer is described herein. As an example, the SOI wafer may comprise a silicon layer located on a silicon dioxide layer. The top Silicon layer is preferable float zone Silicon having low carbon concentration. To obtain the decreased size of the strip waveguide, thickness of the silicon layer is decreased through oxidation. Silicon dioxide formed through oxidation of the silicon layer is then removed resulting in a thin silicon layer. To illustrate, one example of this process may be starting with an initial silicon thickness of five hundred nanometers, and thinning the silicon layer to two hundred and twenty nanometers through oxidation, resulting in Silicon dioxide. The Silicon dioxide may then be removed by using buffered hydrofluoric acid, resulting in the two hundred and twenty nanometer thick silicon layer.

Silicon dioxide is then formed (e.g., grown) in a pattern on a portion of the surface of the silicon layer (block 204). The formed silicon dioxide is referred to herein as the top silicon dioxide layer 120. As an example, thermal oxidation may be used to grow the silicon dioxide to be approximately ninety nanometers in height and lithographically defined to be five hundred and twenty nanometers in width. Since the process of thermal oxidation is well known to those having ordinary skill in the art, the process is not described herein. The portion of the Silicon layer that is located beneath the top Silicon dioxide layer 120 is referred to herein as the center region 110. Additional annealing in Nitrogen with the thermal oxide present may be performed to increase the Oxygen concentration in the Silicon layer.

The portion of the Silicon layer that is not located directly beneath the top Silicon dioxide layer 120 is then thinned (block 206). As an example, the portion of the Silicon layer that is not located directly beneath the top Silicon dioxide layer 120 may be dry etched to decrease the thickness of the Silicon to approximately fifty nanometers. The result is a Silicon layer 104 being approximately fifty nanometers in thickness, except for at the center region 110, which is approximately two hundred and twenty nanometers in thickness. It should be noted that the center region 110 may be between 250 nanometers and 650 nanometers in width and between two 150 nanometers and 400 nanometers in thickness.

The Silicon layer 104 may then be etched to define the width of the photodiode 100 (block 208). Since one having ordinary skill in the art would know how to etch the Silicon layer 104, this process is not described herein.

Figure 5:
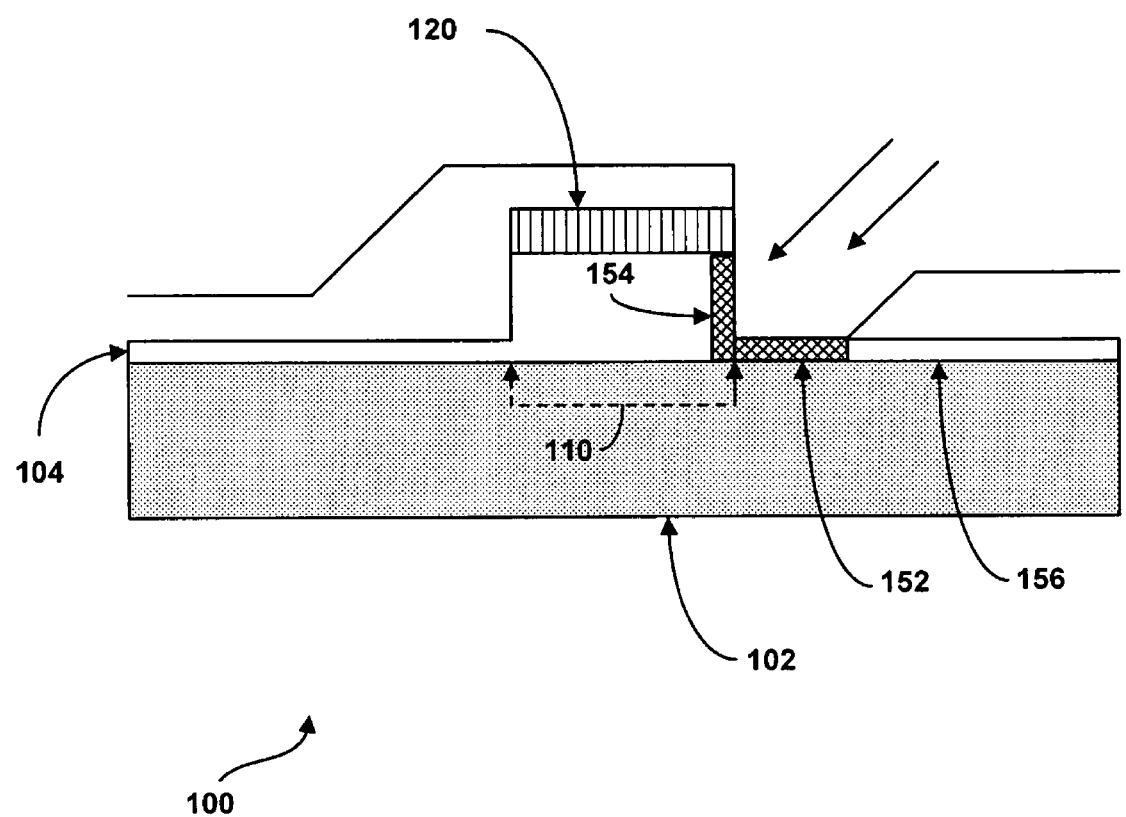
FIG. 5 is a schematic diagram further illustrating the photodiode of FIG. 1 during doping of the right side of the center region and the second right portion of the Silicon layer.

While protecting the top Silicon dioxide layer 120, a left side of the center region 110, the portion of the Silicon layer 104 that is located to the left of the center region 110, and a first right portion 156 of the Silicon layer 104 that is located to the right of the center region 110, the right side of the center region 110 and a second right portion 152 of the Silicon layer 104 are doped (block 210). FIG. 5 is a schematic diagram further illustrating the photodiode 100 during doping of the right side of the center region 110 and the second right portion 152 of the Silicon layer 104. Doping of the right side of the center region 110 and the second right portion 152 of the Silicon layer 104 defines the second wing 150, where the second right portion 152 of the Silicon layer 104 is also referred to herein as the bottom portion 152 of the second wing 150, and the right side of the center region 110 is also referred to herein as the side portion 154 of the second wing 150. Therefore, doping of the right side of the center region 110 and the second right portion 152 of the Silicon layer 104 also defines height of the side portion 154 and the bottom portion 152 of the second wing 150.

Since the first exemplary embodiment of the invention illustrates a photodiode 100, in accordance with the first exemplary embodiment of the invention the right side of the center region 110 and the second right portion 152 of the silicon layer 104 are n-type doped. For n-type doping, n-type dopants, such as, but not limited to, Phosphorous and Arsenic, may be used. One having ordinary skill in the art would appreciate that other materials and manners of n-type doping may be used.

Figure 6:
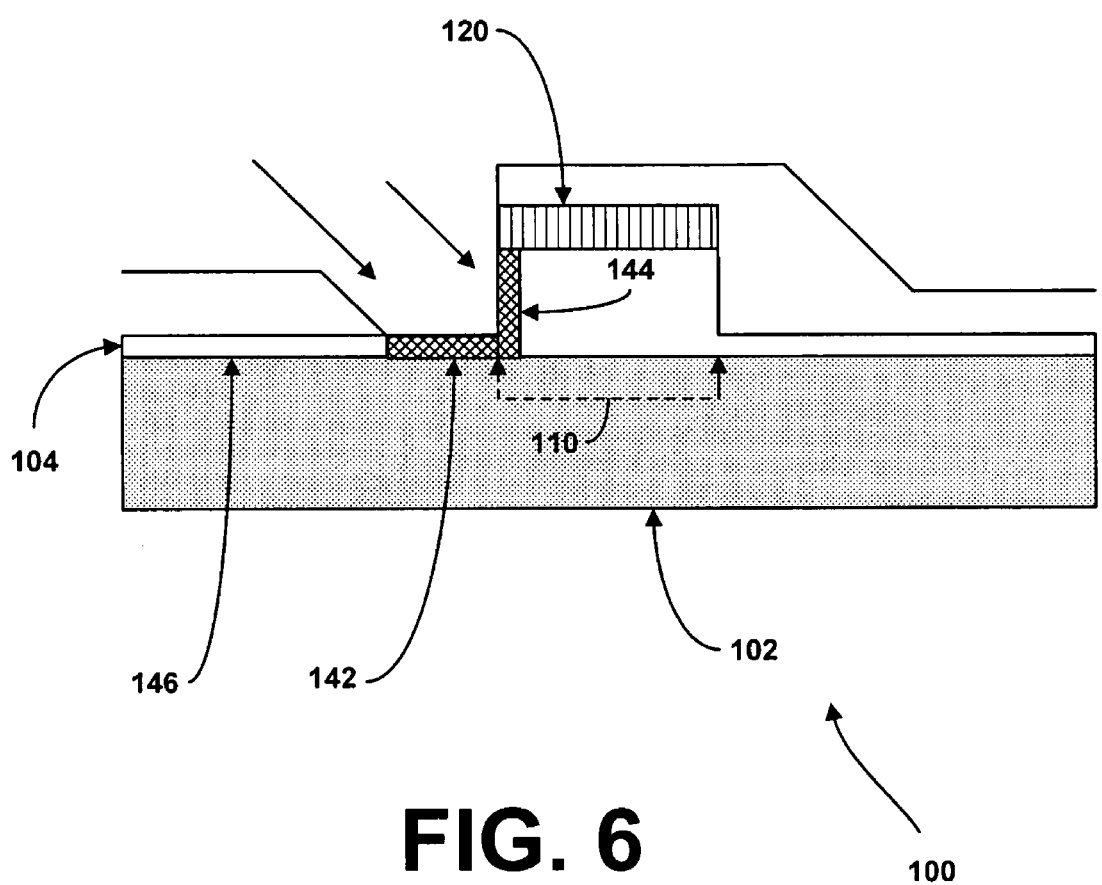
FIG. 6 is a schematic diagram further illustrating the photodetector of FIG. 1 during doping of the left side of the center region and the second left portion of the Silicon layer.

While protecting the top Silicon dioxide layer 120, a right side of the center region 110, the portion of the Silicon layer 104 that is located to the right of the center region 110, and a first left portion 146 of the Silicon layer 104 that is located to the left of the center region 110, the left side of the center region 110 and a second left portion 142 of the Silicon layer 104 are doped (block 212). FIG. 6 is a schematic diagram further illustrating the photodiode 100 during doping of the left side of the center region 110 and the second left portion 142 of the Silicon layer 104. Doping of the left side of the center region 110 and the second left portion 142 of the Silicon layer 104 defines the first wing 140, where the second left portion 142 of the Silicon layer 104 is also referred to herein as the bottom portion 142 of the first wing 140, and the left side of the center region 110 is also referred to herein as the side portion 144 of the first wing 140. Therefore, doping of the left side of the center region 110 and the second left portion 142 of the Silicon layer 104 also defines height of the side portion 144 and the bottom portion 142 of the first wing 140.

Since the first exemplary embodiment of the invention illustrates a photodiode 100, in accordance with the first exemplary embodiment of the invention the left side of the center region 110 and the second left portion 142 of the Silicon layer 104 are p-type doped. For p-type doping, p-type dopants, such as, but not limited to, Boron and Aluminum, may be used. Additionally doping of the Silicon wings 140, 150 hundreds of nanometers away from the central region 110 may be required to make them more conductive and to make electrical contact. One having ordinary skill in the art would appreciate that other materials and manners of p-type doping may be used.

In accordance with an alternative embodiment of the invention, the p-type and n-type doping may be followed by a seven second 1000 C anneal in three percent Oxygen and Argon to form the n and p regions and remove doping crystal damage. It should be noted that the thinned and doped silicon wings (i.e., fifty nanometers thick) on either side of the photodiode 100 do not significantly modify optical mode.

The first wing 140 and the second wing 150 of the photodiode 100, as well as the Silicon layer 104, are then protected and ion implantation is performed on the top Silicon dioxide layer 120 (block 214) resulting in the active region 130 of the center region 110. Dimensions of the active region 130 may be, for example, but not limited to, two hundred and twenty nanometers in height and four hundred and twenty nanometers in width.

In accordance with the first exemplary embodiment of the invention, through ion implantation directed toward the top Silicon dioxide layer 120, Silicon ions are implanted into the top Silicon dioxide layer 120. The result of ion implantation is crystal defects in the active region 130. As an example, $1\times10^{13}$ cm$^{-2}$, 190 keV Silicon may be used for implanting, thereby forming crystal defects in the active region 130.

In addition, since the Silicon ions were ion implanted through the top Silicon dioxide layer 120 and into the active region 130, Oxygen atoms are carried into the active region 130 by the energetic Silicon ions. The Oxygen atoms located within the active region 130 stabilize ion implantation damage of the active region 130, resulting in the photodiode 100 having enhanced thermal stability. Alternatively the Oxygen doping can be done by Oxygen ion implantation and by thermal annealing in an Oxygen or Oxygen-Nitrogen atmosphere. As an example, control of defects in the active region 130, as mentioned above, results in substantial increase in thermal stability in photoresponse of the photodiode 100 even above four-hundred fifty degree Celsius anneal.

One having ordinary skill in the art would appreciate that photoresist may be used for covering necessary portions of the photodiode 100 during doping. The photoresist may be removed in an $O_2$—$N_2$ plasma at ~300 C for sixty seconds. Of course, other manners of covering necessary portions of the photodiode 100 during doping may be used.

Contacts may then be provided on ends of the Silicon layer 104 (block 216). As an example, the first contact 162 may be provided approximately 900 nanometers to the left of the center region 110, and the second contact 164 may be provided approximately 900 nanometers to the right of the center region 110. Depositing through electron beam evaporation may provide the metal contacts 162, 164. Optionally, after deposition, annealing to 450 C for 20 seconds can increase the conductance between the metal (block 218). Alternatively, annealing may be done at or above 250 C, or at a different temperature or for a different time period. It should be noted that it is preferable to have the first conductive contact 162 less than approximately 1500 nanometers to the left of the center region 110, and the second conductive contact 162 less than approximately 1500 nanometers to the right of the center region 110.

The result of reduced waveguide photodetector width 110 and using a strip waveguide, primarily rectangular in cross section, instead of a rib waveguide and the larger overlap between the optical mode and the damaged active region results in increasing optical absorption, reducing required photodetector length and increasing frequency response.

It should be emphasized that the above-described embodiments of the present invention are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

We claim

1. A Silicon photodetector, comprising:
   an insulating substrate having a top surface and a bottom surface;
   a Silicon layer located on said top surface of said insulator substrate, wherein said Silicon layer contains a center region, with said center region being larger in thickness than the rest of said Silicon layer;
   a top Silicon dioxide layer that is located on a top surface of said center region;
   a left wing of said center region, wherein a side portion of said left wing is a left side portion of said center region and a bottom portion of said left wing is a first portion of said Silicon layer that is located to the left of said center region;
   a right wing of said center region, wherein a side portion of said right wing is a right side portion of said center region and a bottom portion of said right wing is a second portion of said Silicon layer that is located to the right of said center region; and
   an active region located within said center region, wherein said active region contains a tailored crystal defect-impurity combination and Oxygen atoms,
   wherein said center region is separated from the rest of said Silicon layer by said left wing and said right wing.

2. The photodetector of claim 1, wherein dimensions of said active region are approximately two hundred and twenty nanometers in height and four hundred and twenty nanometers in width.

3. The photodetector of claim 1, further comprising a first conductive contact located to a left side of said center region, and a second conductive contact located to a right side of said center region.

4. The photodetector of claim 3, wherein said first conductive contact is located approximately 900 nanometers to the left of said center region and said second conductive contact is located approximately 900 nanometers to the right of said center region.

5. The photodetector of claim 1, wherein said insulator substrate is Silicon dioxide.

6. The photodetector of claim 1, wherein said center region is approximately five hundred and twenty nanometers in width and approximately two hundred and twenty nanometers in thickness.

7. The photodetector of claim 1, wherein said top Silicon dioxide layer is approximately ninety nanometers in height and approximately five hundred and twenty nanometers in width.

8. The photodetector of claim 1, wherein said left wing is p-type doped and said right wing is n-type doped.

9. The photodetector of claim 1, wherein said left wing and said right wing are p-type doped.

10. The photodetector of claim 1, wherein said left wing and said right wing are n-type doped.

11. A chip comprising:
    a waveguide;
    at least one optical filter connected to the waveguide;
    at least one Silicon photodetector connected to the optical filter; and
    an integrated circuit connected to the Silicon photodetector, wherein the Silicon photodetector further comprises:
    a insulating substrate having a top surface and a bottom surface;
    a Silicon layer located on said top surface of said insulating substrate, wherein said Silicon layer contains a center region, said center region being larger in thickness than the rest of said Silicon layer;
    a top Silicon dioxide layer that is located on a top surface of said center region;
    a left wing of said center region, wherein a side portion of said left wing is a left side portion of said center region and a bottom portion of said left wing is a first portion of said Silicon layer that is located to the left of said center region;
    a right wing of said center region, wherein a side portion of said right wing is a right side portion of said center region and a bottom portion of said right wing is a second portion of said Silicon layer that is located to the right of said center region; and
    an active region located within said center region, wherein said active region contains a tailored crystal defect-impurity combination and Oxygen atoms,
    wherein said center region is separated from the rest of said Silicon layer by said left wing and said right wing.

* * * * *